United States Patent [19]

Zazzu et al.

[11] Patent Number: 4,897,655
[45] Date of Patent: Jan. 30, 1990

[54] HIGH SPEED APPARATUS FOR A SINGLE LATCH FLASH ANALOG-TO-DIGITAL CONVERTER

[75] Inventors: Victor Zazzu, Montgomery Township, Somerset County; Stanley F. Wietecha, South Bound Brook; Mandel Glincman, Hillsborough Township, Somerset County, all of N.J.

[73] Assignee: Harris Semiconductor Patents, Inc., Melbourne, Fla.

[21] Appl. No.: 166,483

[22] Filed: Mar. 10, 1988

[51] Int. Cl.[4] .............................................. H03M 1/36
[52] U.S. Cl. ..................................... 341/159; 341/158
[58] Field of Search ............... 341/126, 133, 136, 155, 341/156, 158, 154, 159; 307/362, 571

[56] References Cited

U.S. PATENT DOCUMENTS 4,612,531  9/1986  Dingwall et al. .................... 341/159
4,691,189  9/1987  Dingwall et al. .................... 341/158

Primary Examiner—William M. Shoop, Jr.
Assistant Examiner—Brian K. Young
Attorney, Agent, or Firm—Henry I. Schanzer; W. J. Shanley; C. C. Krawceyk

[57] ABSTRACT

There is disclosed a high-speed decoding apparatus for use in a flash-type analog-to-digital converter. The apparatus disclosed employs an OR gate which follows an AND gate which AND gate is conventionally employed in a comparator associated with such a converter. The OR gate functions to block any dynamic movement of the unknown input voltage from being transferred to the decode lines of the analog-to-digital converter. To further gain speed, autozeroed inverters are coupled to the output of the OR gate to further assure that the decoder lines are rapidly driven to therefore gain an extra advantage in high-speed operation of the converter employing the apparatus as described.

17 Claims, 4 Drawing Sheets

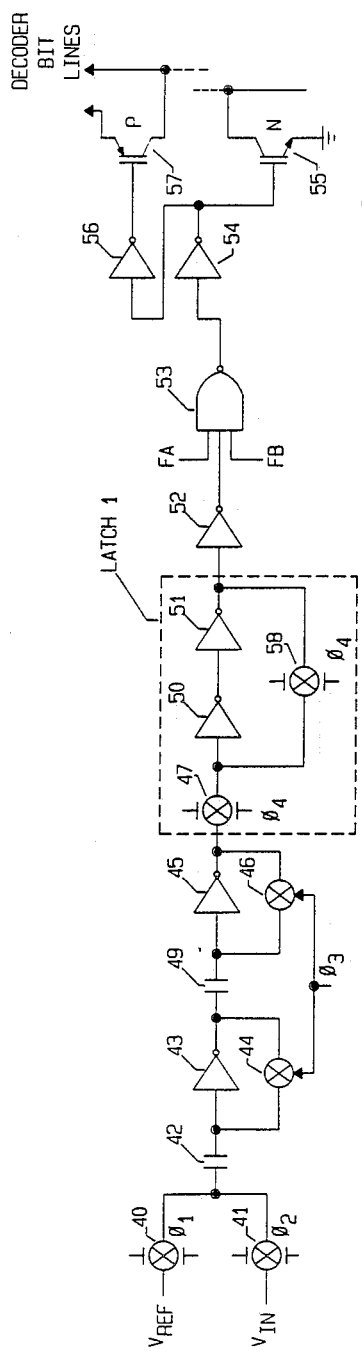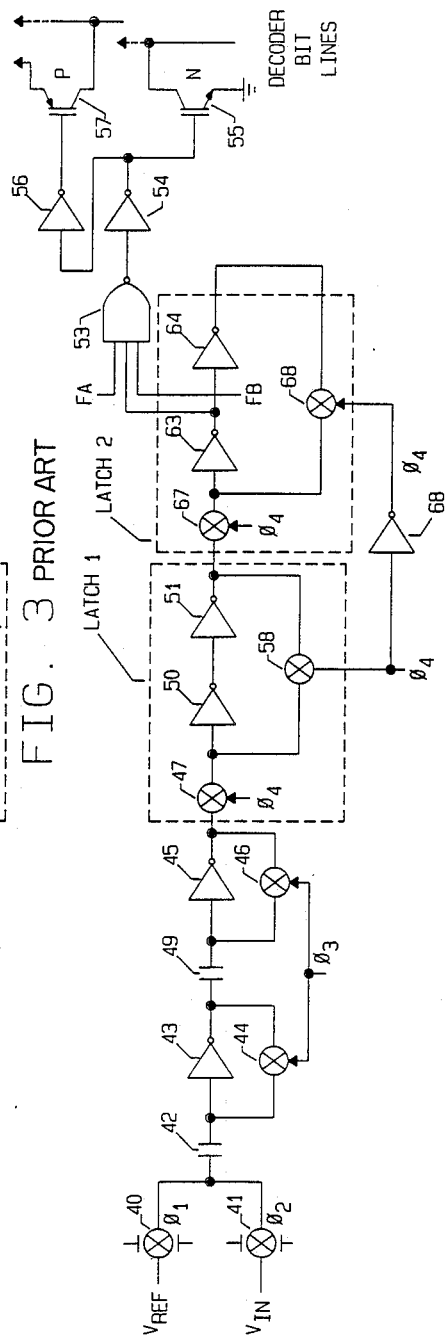

HIGH SPEED APPARATUS FOR A SINGLE LATCH FLASH ANALOG-TO-DIGITAL CONVERTER

BACKGROUND OF THE INVENTION

This invention relates generally to flash-type analog-to-digital converters and more particularly to a flash-type analog-to-digital converter employing a high speed decoding apparatus.

As is well known, flash-type analog-to-digital (A/D) converters also referred to as parallel converters are widely employed to develop ultra-fast conversions which are of the type for example required in video signal processing, in radar applications and other applications as well. In regard to such techniques up to 8 bits resolution is normally required, and in order to accommodate ultra-fast conversions with such resolution, the prior art has employed parallel or flash converters.

Flash or parallel type A/D converters or, as they are sometimes called, simultaneous A/D converters offer high speed of operation and are probably the highest speed type of converter available. Such converters use an analog comparator for every quantization level in the coded digital word. Since the conversion is performed in one step, rates of 100 megabits per second or greater can be achieved. However, because the amount of equipment needed is practically doubled for each additional binary bit of resolution, parallel converters are usually employed where the requirement is for low resolution, that is, high speed 3-to 8-bit conversions systems.

A limitation of the method in parallel converters is the large number of comparators required for even moderate resolutions. For example, a 4-bit converter requires only 15 comparators, but an 8 bit converter needs 255. Hence, the prior art has employed many techniques in order to improve operation of such parallel converters. For examples of typical devices, reference is made to a text entitled *Analog-to-Digital /Digital-to-Analog Conversion Techniques* by David F. Hoeschele, Jr., published by John Wiley & Sons, Inc. 1968. See Chapter 12 entitled "Analog-to-Digital Converter Design", pages 366 to 429. There are of course many other examples of flash analog-to-digital converters in the prior art.

In a flash analog-to-digital converter whether it be fabricated by CMOS technology or otherwise an error code condition can occur at a specific sampling frequency and input bandwidth which is commonly known as a "sparkle". The term "sparkle" is derived from the fact that such converters may be employed in television systems and when two codes are simultaneously decoded a pixel appears as a bright spot due to the error and appears as a "sparkle" on the television display. A "sparkle" occurs when two codes are simultaneously decoded; thus a "sparkle" could occur based on the following. For example, a first code could be indicative of 0111 1111 (127). A second code would be 1000 0000 (128). The combination of codes 1 and 2 would yield all ones or 1111 1111 (255). The error results in a decimal decode of 255 instead of 127 or 128 and this is an extremely large error indicative of a "sparkle". The "sparkle" can occur under two conditions. The first condition is at a high sampling rate and there will always be a sampling frequency where the decoder is simply not fast enough to decode the correct count.

A second condition is where one is operating with a high slew rate input signal. If the input signal has a high slew rate condition then the comparators and the decoder might not be able to track the input. The prior art as will be subsequently explained, proposed various solutions to solve the "sparkle" problem. One prior art solution employed double latched comparators in order to circumvent the "sparkle" problem. However this scheme requires two latches and introduces additional delay.

It is therefore an object of the present invention to provide apparatus which operates in conjunction with a flash analog-to-digital converter and which apparatus serves to circumvent the above-noted "sparkle" problem while further providing high-speed decoding.

BRIEF DESCRIPTION OF THE PREFERRED EMBODIMENT

In a comparator circuit particularly adapted for use in a flash-type analog-to-digital converter, said comparator having a latch circuit and having one input coupled to one of a plurality of resistors in a reference ladder, and another input coupled to an input signal to be converted, said comparator including an AND gate having one input coupled to the output of said latch and having other inputs responsive to the states of other comparators monitoring said ladder s above and below said comparator to provide an output signal indicative of the state of said input signal by comparing the magnitude of said input signal with said reference level from said ladder and for applying said output signal to decoder bit lines, the combination therewith of apparatus to enable high speed decoding while reducing the response of said comparator circuit to an undesirable "sparkle" condition, comprising an actuatable OR gate having one input coupled to the output of said AND gate and actuated during a given period to provide an output signal when said input signal to said comparator circuit is stable, and means coupling the output of said OR gate to said decoder lines.

BRIEF DESCRIPTION OF THE FIGURES

FIG. 3 is a detailed block schematic diagram depicting a single latch comparator of the type employed in the prior art.

FIG. 4 is a schematic block diagram depicting a double latched comparator of the type employed in the prior art.

DETAILED DESCRIPTION OF THE FIGURES

Figure 1:
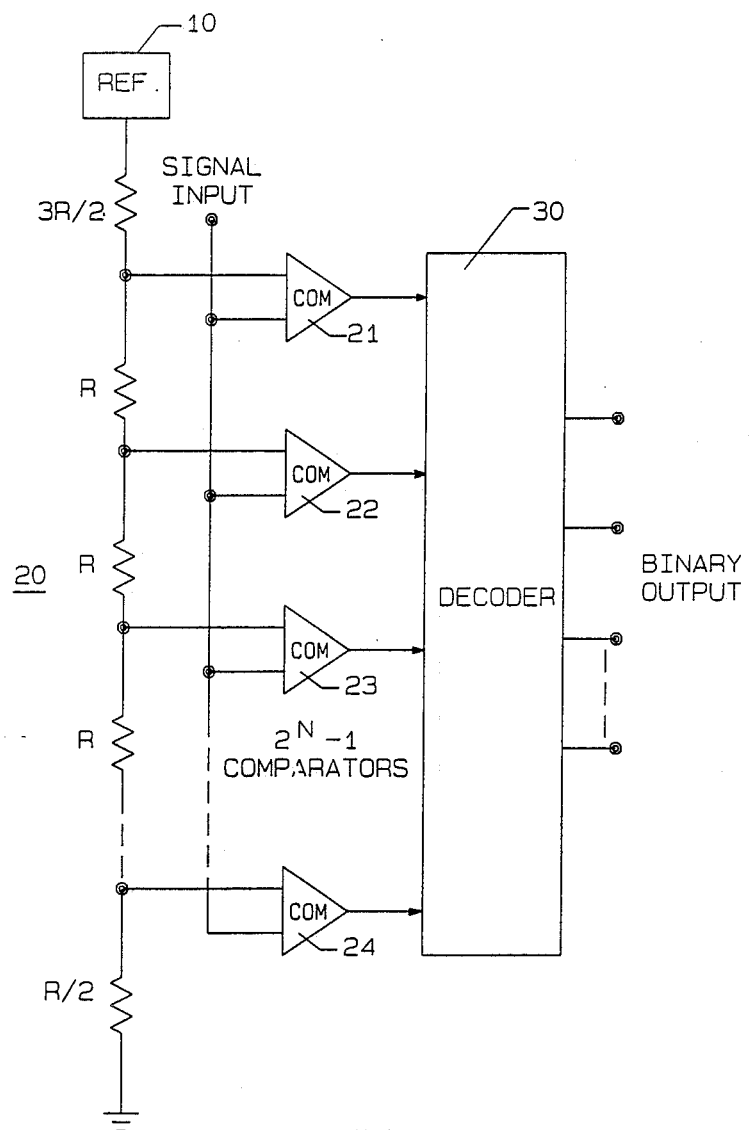
FIG. 1 is a simple block diagram depicting a flash analog-to-digital converter of the type employed in the prior art and useful for explaining the operation of this invention.

Referring to FIG. 1, there is shown a simple block diagram depicting a flash- or parallel-type converter of the type employed in the prior art and useful in describing and understanding the invention herein.

As can be seen from FIG. 1, a flash- or simultaneous- or parallel-type analog-to-digital converter employs a source of reference potential 10. The source of reference potential 10 is coupled to ground via a reference resistor chain or ladder 20. As seen each of the resistors in the ladder is monitored by a comparator as for example comparators 21 to 24. It is of course understood by means of the dashed lines shown in FIG. 1 that the analog-to-digital converter apparatus can employ a plurality of such comparators and as indicated above, for an 8-bit unit would employ 255 comparators. In any event, the outputs of the comparators are respectively coupled to a decoder circuit 30 which circuit operates to decode the comparator outputs to provide a binary output suitable for utilization by typical digital signal processing circuits.

The operation of the circuit in FIG. 1 is as follows. As can be understood, an N-bit analog-to-digital converter employs $2^N-1$ analog comparators such as 21 to 24 to directly implement the quantizer transfer function of an analog-to-digital converter. The comparator trip points are spaced 1 LSB (least significant bit) apart by the series resistor ladder 30 as coupled to the voltage reference source 10. For a given analog input voltage designated by signal input, all comparators which are biased below the value of the input voltage turn on, and those biased above the value of the input voltage remain in the off condition. Since all the comparators such as 21 to 24, change state simultaneously, the quantization process is a one-step operation.

In any event, a second step is required since the logic output of the comparators is not normally in binary form. Therefore, an ultra-fast decoder circuit 30 is employed to make the logic conversion to a suitable binary code. The parallel technique as indicated reaches the ultimate in high speed operation because only two sequential operations are required to make the conversion. As indicated above and as known in the prior art, the limitation, however, is in the large number of comparators required for even moderate resolutions.

Figure 2:
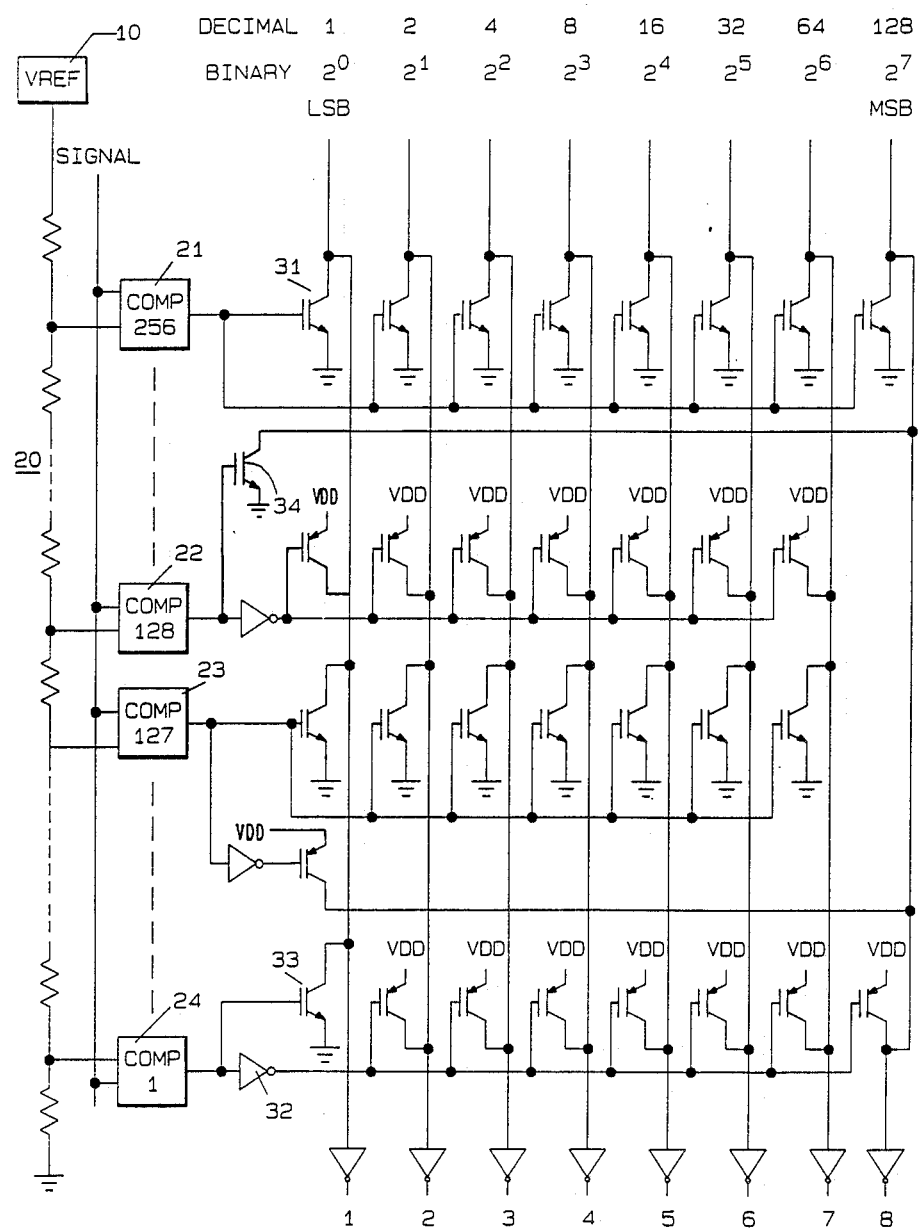
FIG. 2 is a block diagram showing a typical decoder employed with a flash A/D converter.

Referring to FIG. 2, there is shown a typical decoder such as the decoder 30 of FIG. 1 which is conventionally employed in a flash-type A/D converter. As can be seen, the comparators have been referenced with the same reference numerals as employed in FIG. 1. Essentially, comparator 21 is the last comparator in the chain and operates to decode decimal 255. The comparator 21 is also designated as comparator 256. As can be seen, the output of the comparator 21 is coupled to N-channel devices associated with each of the binary bits from the least significant bit 1 to the most significant bit 8. Hence when comparator 21 provides an "high" output, all output lines such as lines 1 2, 3, 4, 5, 6, 7, 8 go high, indicative of the decimal output 255 or binary 1111 1111. Each output line 1-8 is coupled to an N-channel device such as 31 for line 1. The other N-channel devices are shown by X's. As can further be seen, there is a comparator 24 which essentially is the lowest order comparator. Comparator 24, when providing an output, turns N-channel transistor 38 ON to provide a high on the least significant bit line 1 indicative of decimal 1. The remaining lines are coupled via the inverter 32 to P-channel devices whereby lines 2–8 are then activated to provide lows at the same time line 1 is high. In FIG. 2, comparators 22 and 23 are designated as comparators 128 and 127. Comparator 128, when operated, provides an output of 1000 0000 (128) while comparator 127, which is immediately below comparator 128 in the chain, will provide an output indicative of decimal 127 or binary 0111 1111. If the input signal is slewing rapidly or at a high sample rate, there is a condition where the decoder will be confused and comparators 128 and 127 could be operated at the same time. If this occurred then comparator 128 would activate the N-channel device 34 thus providing a 1 at the most significant bit line 8. In the same manner comparator 127 would be activated thus providing all ones on lines 1–7 with a zero on line 8. Due to the fact that both comparators 127 and 128 are operative, there will be all ones provided by the decoder shown in FIG. 2. Hence, based on this error, the output signal would be, indicative of decimal 255 instead of, for example, 127 or 128. This is a significant error and will result in a "sparkle" condition. The "sparkle" or all "logic 1" conditions occur when two decoder input lines are simultaneously activated; due to the dominant drive capability of the N-channel MOS FET (a larger P channel MOS FET would reproduce an All logic "0" sparkle. The decoder depicted in FIG. 2 is the type of decoder which is employed in flash-type converters of concern.

As seen in FIG. 3, the voltage reference input which is a tap on the resistor chain 20 of FIG. 1 is applied to one switching device 40. The switching device 40 may be a conventional CMOS P or N channel FET device and is a series switch which is operated by means of given clock frequency designated in the drawings as $\phi_1$. A second switch 41 operates with a different clock designated as $\phi_2$. The type of operation whereby clocks are employed to selectively and sequentially activate switches in conjunction with comparators or in conjunction with sample and hold circuitry is a well known technique. The clocks employed, such as those shown in FIG. 3 as $\phi_1$, $\phi_2$, $\phi_3$ and $\phi_4$ are of different durations but may be out of or in phase with respect to one another. The providing of switching clock signals is well known and is used to transfer charge via switches between capacitors and so on. The sequence of clock signals for the circuit of FIG. 3 is conventional and for example $\phi_1$, $\phi_3$ and $\phi_4$ go off simultaneously but may be of different durations and then $\phi_2$ comes on after a small delay. The sequence commences inversely. As seen in FIG. 3, the output of switches 40 and 41 are coupled respectively to a capacitor 42 which thereby can selectively receive a charge according to the reference voltage or according to the input voltage. The capacitor 42 is coupled to the input of an inverter 43 which has its input and output terminal coupled together via a switch 44.

Switch 44 is operated by means of $\phi_3$ of the clock. The output of the inverter 43 is coupled to a terminal of a capacitor 49 having the other terminal coupled to the input of another inverter 45. The input and output of inverter 45 again are coupled together via a switch 46 which again is operated during the $\phi_2$ phase of the clock. The switches serve to autozero the inverters. The technique of autozeroing is well known. The output of inverter 45 is coupled through a switch 47 which is operated by the phase IV or $\phi_4$ of the clock signal. The output of switch 47 is coupled to the input of an inverter 50 in series with an inverter 51. The input of inverter 50 is coupled to the output of inverter 51 via a switch 58 which is operated by the inverted $\phi_4$ signal of the clock. The output of inverter 51 is also coupled to an inverter 52 whose output is coupled to one input of a NAND gate 53.

One input of the NAND gate 53 is coupled to the output of a comparator above this comparator while the other input of the NAND gate 53 is coupled to the output of a comparator below the comparator of FIG. 3. For example, and referring to FIG. 2, assume the comparator shown is comparator 23 (127) of FIG. 2.

Then one input of gate 53 is coupled to the output of comparator 22 (128) which is "above" 127 and the other input is coupled to the output of a comparator 126 (not shown) which is "below" comparator 127. The output of the NAND gate 53 is coupled to an inverter 54 having an output directly couple to the gate electrode of a grounded source N channel FET device 55 whose drain electrode is connected to a first decoder bit line as seen in FIG. 2. The output of inverter 54 is also coupled to the input of a second inverter 56 having its output coupled to a P channel FET device 57 to provide complementary decoder bit line values (See FIG. 2).

As indicated, the device shown in FIG. 3 has been employed in the prior art and is a single latch device wherein the latch circuit consists of inverters 50, 51 with the associated switches 58 and 47. In regard to FIG. 3 the comparison cycle consists of one clock cycle which is as follows.

First the amplifying stages are autozeroed and VREF is applied via switch 40 to capacitor 42. Then the input signal designated as VIN is sampled and the latch 50, 51 coupled via switch 58 is placed in the track mode as switch 47 is closed and switch 58 is opened. It is noted that when switch 58 is opened amplifiers 50 and 51 are in the track mode and the circuit including the decoder network basically follows any movement in the input voltage by amplifying the data. At the end of the track mode, switch 58 is closed and amplifiers 50 and 51 operate to latch the data. The data latch latches the amplifier data and the decision is coded into the decoder for the correct output code. This is what occurs in the operation of the circuit of FIG. 3.

It may be possible that the decoder bit lines need to recover from a low voltage to a high voltage at the maximum conversion rate. If the decoder does not recover, a "sparkle" can occur in regard to the circuit shown in FIG. 3.

Referring now to FIG. 4, there is shown another prior art approach whereby a double latched comparator design is shown. It is seen that various components which are the same as those in FIG. 3 have been indicated by the same reference numerals where appropriate.

The operation of the circuit and the components are similar with the exception that there are two latches which are shown in FIG. 4. The first latch (latch #1) consists of the inverters 50 and 51 and switches 58 and 47. The second latch (latch #2) consists of inverters 63 and 64 with switches 66 and 67. It is noted that switch 67 follows latch 1 including inverters 50 and 51 and is turned on during the phase $\phi_4$ cycle of the clock while latch 2 receives its input from switch 67 and includes inverters 63 and 64 with switch 66 operating during the inverted phase $\phi_4$ of the clock. By utilizing the double latched circuit, a "sparkle" free- high sampling- frequency is achieved by blocking any dynamic movement of the input signal and applying only stable logic states from the output of latch #1 to the decoder circuitry. The double latched design shown in FIG. 4 requires an extra latch which introduces an extra stage delay in the data path. However, in most applications this is not a problem. There are some applications where this delay is not preferred, for example in subranging architecture methods and so on.

The phases of the clock in FIG. 4 are as indicated for FIG. 3 and operate to sequentially program circuit operation. In this manner phases $\phi_1$, $\phi_3$, and $\phi_4$ go off simultaneously and then $\phi_2$ comes on after a small delay as indicated above. The clocking sequence for operating comparator circuits such as those shown in FIGS. 3 and 4 is well known in the prior art and need not be described in detail.

Figure 5:
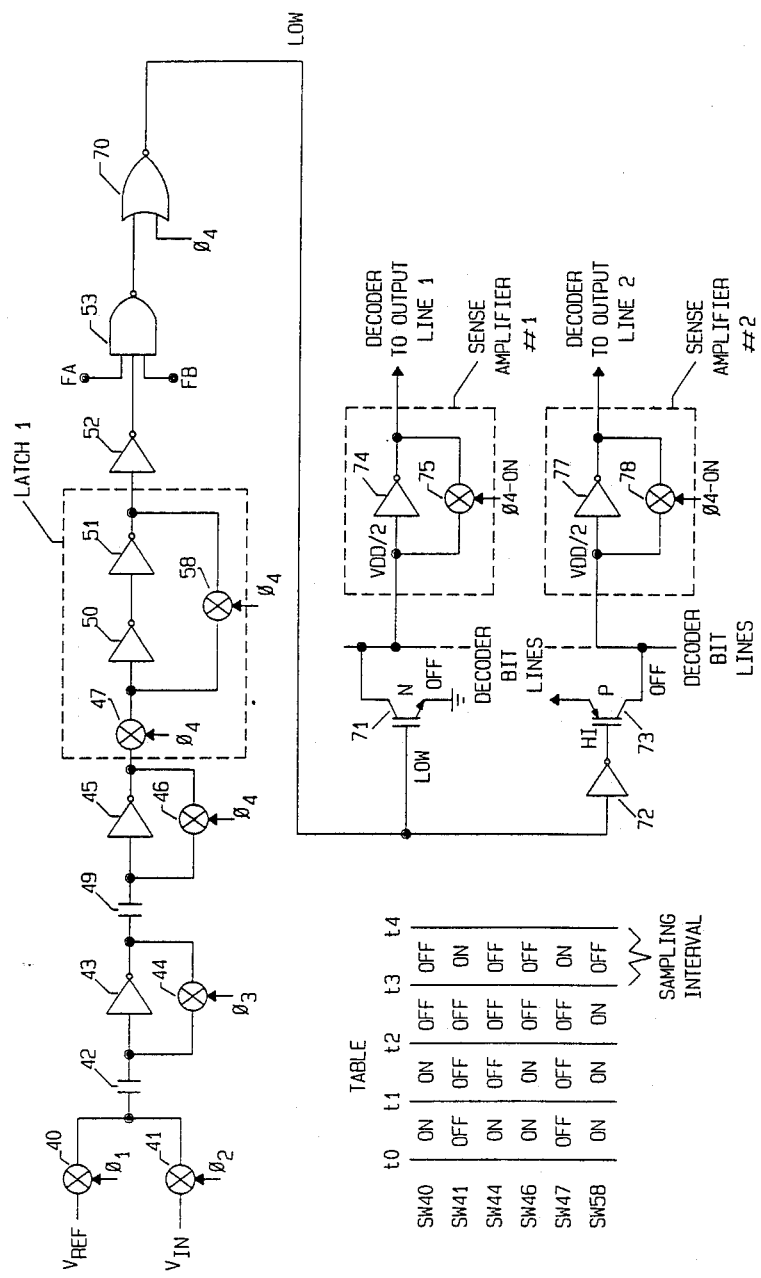
FIG. 5 is a high-speed comparator and decoding apparatus for a flash analog-to-digital converter according to this invention.

Referring to FIG. 5, there is shown the high-speed converter and decoding apparatus for a CMOS or other flash analog-to-digital converter according to this invention. Many of the amplifier and latching stages are the same as those shown in FIG. 3, and therefore the same reference numerals have been maintained to indicate the same functioning parts. It is noted that the output of the single latch (latch #1) which is identified by the output of inverter 52 is coupled to the same NAND gate 53 which operates as gate 53 of FIG. 3. In FIG. 5 there is shown a NOR gate 70 which replaces inverter 54. NOR gate 70 functions to block any dynamic movement of the unknown input signal voltage from being transferred to the decoder while in the track mode (sampling interval). The increased speed of the decoder comes from the DC connected autozeroed inverters such as inverters 74 and 77 which are connected to the decoder output lines.

The clock sequence for the circuit of FIG. 5 is not the same as for FIGS. 3 and 4. In FIG. 5 $\phi_3$ goes low first then $\phi_1$ goes low and then $\phi_2$ and $\phi_4$ goes high. This to be understood by those skilled in the art.

The following describes the operation of the circuit shown in FIG. 5. As can be seen, the two amplifiers 43 and 45 are autozeroed by closing the switches 44 and 46 during the phases $\phi_3$ III and IV $\phi_4$ of the clock. This serves to bias the inverters so that they are operating in their highest gain region. The autozeroing of the amplifiers 43 and 45 occurs during the clock $\phi_3$ and $\phi_4$ respectively. During clock $\phi_1$, the capacitor 42 is charged to V reference ($V_{REF}$) through the switch 40 which is closed during clock cycle $\phi_1$. Then switches 40, 44, and 46 are switched off, and during clock cycle $\phi_2$, switch 41 is switched on coupling the input signal level to capacitor 42. During clock cycle $\phi_4$, switch 47 is switched on coupling the output of inverter 45 to the input of the inverter 50 forming part of the single latch.

In this manner the amplifiers and the latch "track" the input voltage directly. The three-input NAND gate 53 samples a triplet of comparator latch outputs for a change in the code.

When $\phi_4$ is high (a) the output of NOR gate 70 is always driven low; (b) inverters 74 and 77 are auto zero'ed and driven to their high gain region; and (c) transistors 71 and 73 are turned-off (non-conducting).

When $\phi_4$ is low (a) the output of NOR gate 70 is a function of the signal produced at the output of gate 53 which is applied to the input of gate 70; that is, the output of NOR gate 70 is driven high if the output of gate 53 is low or will remain low if the output of gate 53 is high; and (b) if the output of NOR gate 7 is high then:

(1) N-type transistor 71 is turned-on and the output of inverter 74 is driven high causing the decoder to output to line 1 to also be driven high very quickly; and (2) P-type transistor 73 is also turned-on causing the output of inverter 77 to be driven low causing the decoder to output line 2 to be driven low quickly.

When $\phi_4$ is low, the decoder select lines are set to the high impedance condition also occurring during the $\phi_4$ cycle of the clock via the low output of the NOR gate. The decoder bit line sense amplifiers which are 74 and 77 are autozeroed respectively through switches 75 and 78 which is done during the $\phi_4$ cycle of the clock. During this cycle, the switch 47 is also switched on and is switched off during the $\phi_1$ cycle of the clock. Subsequently, when switch 47 is switched off, switch 58 is switched on and the data is latched via inverters 50 and 51. At this point, the NAND gate 53 has determined where the break is in the code and thus has decoded the appropriate code.

Now the data is stable as it is no longer changing. At this time, the NOR gate 70 is enabled. Since the data is stable, only one count will be decoded indicative of the highest decoding speed available since the bit line sense amplifiers 74 and 77 need only change a small amount. It is, of course, noted that the decoder bit lines are again referenced via the N channel device 71 and the P channel device 73 in order to obtain the 2-bit binary output necessary to properly decode the comparator states. The inclusion of the autozeroed inverters 74 and 77 assure that the decode lines are driven rapidly to accommodate shunt capacity as the inverters serve to rapidly drive the decode lines.

The table shown in FIG. 5 shows when the switches of interest are turned ON and OFF by the clock signals or during the time intervals specified. Thus during the sampling interval all decoding transistors are turned OFF which therefore inhibits the propagation of the "dynamic" signal. The decoder bit lines are then free to float, but they are autozeroed by switches 75 and 78 being directly driven to VDD/2. At the end of the sampling period, the data is latched. The latched data is then propagated and applied to the decoding transistors wherein the autozeroed sense amplifiers 1 and 2 are now acting as amplifiers due to the opening of switches 75 and 78. The high speed decoding is achieved due to the fact that the decoder lines need to slew a small amount for the amplifier to properly determine the binary output.

It is also noted that the circuit shown in FIG. 5 exemplifies one comparator module which can be employed for each of the various comparators as for example those shown in FIGS. 1 and 2.

It is further indicated that the technique of selectively operating switches as well as selectively charging capacitors is generally referred to as charge transfer. Such techniques for selectively operating latches as well as switching circuits during clock intervals are well known in the analog-to-digital conversion art. Many examples of such techniques exist as evidenced by the circuits shown in FIGS. 3 and 4 as indicative of the prior art.

We claim:

1. In a comparator circuit particularly adapted for use in a flash-type analog-to digital converter, said comparator circuit of the type employing a latch device having an output coupled to one input of an AND'ING type gate means with said gate also responsive to the logic states of comparators above said comparator and below said comparator, and said comparator circuit monitoring a source of reference potential by comparing the value of an input signal with a reference level with the output of said AND'ING type gate means providing an input to a decoder means associated with said converter circuit, the improvement therewith of apparatus to enable high speed decoding while reducing the response of said circuit to an undesirable "sparkle" condition, comprising:
   a controllable gate means coupled between the output of said AND'ING type gate means and said decoder means operative to provide an output signal when said input signal to said comparator circuit is stable in value, and
   to then couple a latched value of said input signal to said decoder means.

2. The apparatus according to claim 1, wherein said controllable gate means comprises a NOR gate having one input coupled to the output of said AND'ING type gate means and one input coupled to a clock source for operating said controllable gate means during a specified clock period.

3. The apparatus according to claim 2, wherein said decoder means includes a first inverter having an input coupled to the output of said NOR gate and having an output coupled to the gate electrode of a first polarity FET device with an output electrode of said first polarity FET device coupled to the input of a first autozeroed inverter means having an output coupled to a first decoder line with the output of said NOR gate further coupled to the gate electrode of a second polarity FET device having an output electrode coupled to the input of second autozeroed inverter means having an output coupled to a second decoder line.

4. The apparatus according to claim 3, wherein said first polarity FET device is a N-channel device with said second polarity FET device being a P-channel device.

5. The apparatus according to claim 4, wherein said first and second autozeroed inverter means each include an inverter having an input electrode and an output electrode and having an actuatable switching means coupled between said input and output and operative to autozero said inverter during said clock period.

6. In a comparator circuit particularly adapted for use in a flash-type analog-to-digital converter, said comparator having one input coupled to one of a plurality of resistors in a reference ladder, and another input coupled to an input signal to be converted, said comparator including a single latch circuit and having an input adapted to receive a signal indicative of the difference between the input signal and the reference signal and for converting the difference to a binary value and having an output, and an AND'ING type gate having one input coupled to said output of said single latch and having other inputs responsive to the state of other comparators monitoring said ladder above and below said comparator to provide an output signal indicative of the state of said input signal by comparing the magnitude of said input signal with said reference level from said ladder and for applying said output signal to decoder bit lines, the combination therewith of apparatus to enable high speed decoding while reducing the response of said comparator circuit to an undesirable "sparkle" condition, comprising:
   an actuable OR'ING type gate means having one input coupled to the output of said AND'ING type gate means and actuated during a given period to provide an output signal when said input signal to said comparator circuit is stable, and means coupling the output of said OR gate to said decoder lines.

7. The apparatus according to claim 6, wherein said OR'ING type gate means is a NOR gate.

8. The apparatus according to claim 6, wherein said means coupling the output of said OR'ING type gate means to said decoder lines includes at least one autozeroed inverter having an input coupled to said OR'ING type gate means output and an output coupled to one of said decoder lines;
   a switch coupled between said input and output of said inverter and operative to autozero said inverter during said given period.

9. The apparatus according to claim 8, further including an FET device having a gate electrode coupled to said output electrode of said NOR gate and having at least one output electrode coupled to said input of said autozeroed inverter.

10. The apparatus according to claim 9, wherein said FET device is a CMOS device.

11. The apparatus according to claim 10, wherein said CMOS device is a P-channel device.

12. The apparatus according to claim 10, wherein said CMOS device is an N-channel device 13. The apparatus according to claim 6, further including another autozeroed inverter having an input coupled to said OR gate output via an inverter and having an output coupled to another decoder line and a switch coupled between said input and output for autozeroing said inverter during said given period.

14. The apparatus according to claim 13, further including an FET device having a gate electrode coupled to said output of said OR gate and an output electrode coupled to said input of said another autozeroed inverter.

15. The apparatus according to claim 14, wherein said FET device is a CMOS device.

16. The apparatus according to claim 15, wherein said CMOS device is a P-channel device.

17. The apparatus according to claim 15, wherein said CMOS is an N-channel device.

* * * * *